METHOD OF MAKING A PRINTED CIRCUIT

Filed April 3, 1961 4 Sheets-Sheet 1

INVENTORS
Paul L. Anderson
John A. Zagusta
BY Lazarus Spiwak
George R. Traut
Robert R. Churchill
ATTORNEY INVENTORS
Paul L. Anderson
John A. Zagusta
BY Lazarus Spiwak
George R. Traut
Robert R. Churchill
ATTORNEY INVENTORS
Paul L. Anderson
John A. Zagusta
BY Lazarus Spiwak
George R. Traut
Robert X. Churchill
ATTORNEY

METHOD OF MAKING A PRINTED CIRCUIT

Filed April 3, 1961 4 Sheets-Sheet 4

INVENTORS
Paul L. Anderson
John A. Zagusta
Lazarus Spiwak
George R. Traut

BY Robert L. [illegible]
ATTORNEY

United States Patent Office 3,301,730
Patented Jan. 31, 1967

3,301,730

METHOD OF MAKING A PRINTED CIRCUIT

Lazarus Spiwak, Manchester, George R. Traut, Danielson, and Paul L. Anderson, Vernon, Conn., and John A. Zagusta, Jackson Heights, N.Y., assignors to Rogers Corporation, Rogers, Conn., a corporation of Massachusetts Filed Apr. 3, 1961, Ser. No. 100,226
3 Claims. (Cl. 156—267)

This invention relates to a printed circuit and method of making the same.

The invention has for an object to provide a novel and improved printed circuit embodying a relatively thin dielectric circuit carrying sheet or film having a conductive metal circuit pattern applied thereto.

Another object of the invention is to provide a novel and improved method of producing a printed circuit of the charatcer specified.

A further object of the invention is to provide a novel and improved method of producing a highly efficient printed circuit assembly and bonding the assembly to a base member during the formation of the base member.

With these general objects in view and such others as may hereinafter appear, the invention consists in the printed circuit, in the method of producing the same and in the method of bonding the circuit assembly to a base member during the formation of the base member as hereinafter described and particularly defined in the claims at the end of this specification.

In the drawings illustrating the preferred embodiment of the invention:

Figure 1:
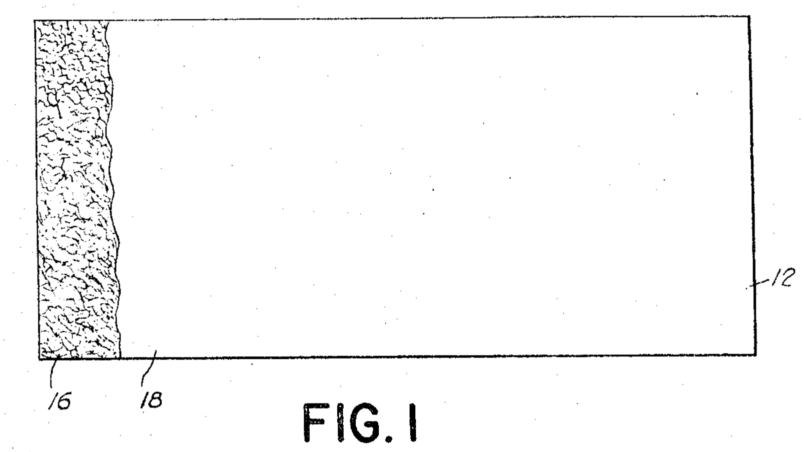
FIG. 1 is a plan view of a relatively thin composite dielectric base sheet or film prior to delineation of the printed circuit thereon.
Figure 2:
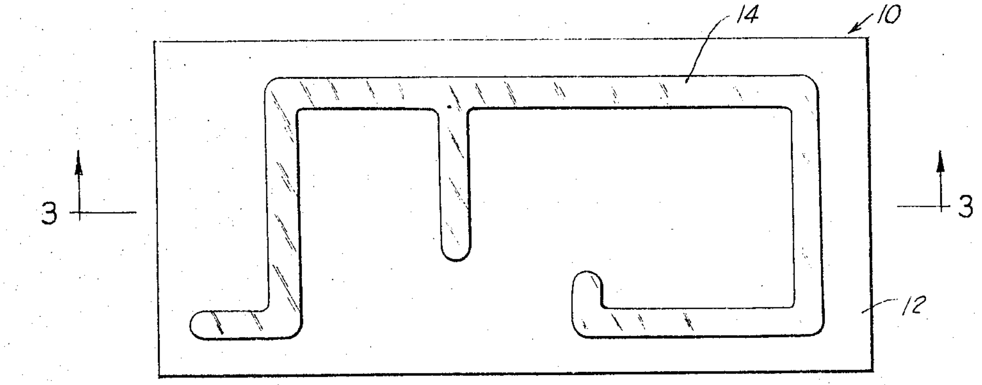
FIG. 2 is a similar view showing a die-cut copper foil circuit pattern applied to the relatively thin base sheet.

In general the present invention contemplates a novel printed circuit structure and method of making the same wherein the printed circuit embodies a relatively thin and flexible dielectric sheet or film comprising the circuit carrying member and on which a metallic foil circuit pattern is delineated, and the method of bonding the metal foil and flexible sheet assembly to a base member during the molding operation for forming the base member from a molding material, such as molding powder or the like. The preferred relatively thin dielectric film may comprise a synthetic fabric, such as Orlon or Dacron, which may be woven or unwoven and which is preferably dipped or coated on both sides with a phenolic or other good commercially available electrical grade resin providing a relatively thin, flexible sheet or film having high dielectric properties.

In accordance with a preferred method of producing the present printed circuit structure a conductive metal foil sheet is placed on or laminated to the relatively thin film and is die-stamped to cut a conductive circuit pattern from the relatively thin foil sheet. In order to permit cutting of the foil without tearing the relatively thin circuit carrying film the composite dielectric film and conductive foil material may be placed on a temporary base of resilient material, such as cork, rubber or the like, which will permit yielding of the film material when the metallic foil pattern is die-cut. In practice such thin dielectric film with the circuit delineated thereon may be secured to a relatively rigid insulating base.

In accordance with another method of producing the present printed circuit, the thin dielectric film and the conductive foil may be initially adhesively secured to a resilient moldable fibrous insulating base material, preferably embodying a curable resin, and the desired circuit then stamped from the metal foil, the base material yielding during the stamping operation to enable the foil to be cut without damage to the thin dielectric film. The composite printed circuit assembly may be placed in a mold after the removal of the unwanted copper and cured by the application of heat and pressure. In this manner an assembly may be produced wherein the metal pattern is disposed substantially flush with the surface of the thin dielectric film on which the pattern is delineated.

In accordance with still another method of producing the present printed circuit assembly a preformed metal foil pattern is applied to a relatively thin, flexible sheet embodying a curable resin. In practice, if desired, the foil may be adhesively secured to the flexible sheet. The assembly is then subjected to heat and pressure to cure the resin and bond the pattern securely to the sheet. The cured assembly may then be bonded to a suitable base sheet.

In accordance with a still further method of producing a printed circuit structure a preformed metal foil pattern is applied to a thin, flexible sheet embodying a curable resin, and the foil and sheet are placed in a mold for forming a base member containing a molding material, such as a molding powder or like material, and subjected to heat and pressure to form the base member, cure the flexible sheet, bond the foil to the flexible sheet and the flexible sheet foil assembly to the base member substantially simultaneously.

Still another method of producing the present printed circuit assembly comprises applying a metal foil sheet on a thin sheet of flexible material embodying a curable resin, cutting the foil against the sheet to form the circuit pattern, removing the unwanted foil and placing the foil sheet assembly in a mold containing a molding material, subjecting the mold to heat and pressure to form a base of a predetermined configuration and simultaneously cure the flexible sheet and bond the flexible sheet and foil assembly to the base.

In still another method of producing the present printed circuit assembly a metal foil circuit pattern is applied to a flexible sheet embodying a curable resin, and the foil sheet assembly is placed in a base forming mold containing a molding material. A metal foil pattern is applied to another flexible sheet having apertures therein and embodying a curable resin. The second foil sheet assembly is then placed in the mold upon the first sheet such that the apertures overlie portions of the circuit on the underlying sheet. The mold is closed and the entire assembly subjected to heat and pressure to form a base member of a predetermined configuration and at the same time bond the flexible sheets to each other and to the base. The circuits of each flexible sheet may be connected to each other in any suitable manner either before or after the assembly has been molded.

Figure 3:
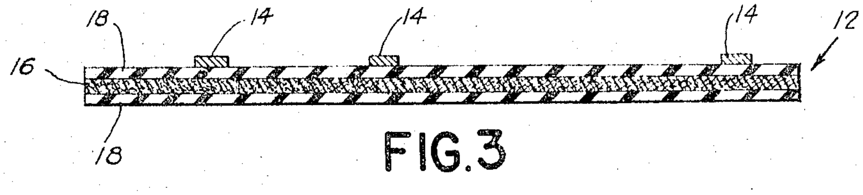
FIG. 3 is a horizontal cross section taken on the line 3—3 of FIG. 2, the vertical dimensions or thicknesses of the elements being greatly enlarged.
Figure 7:
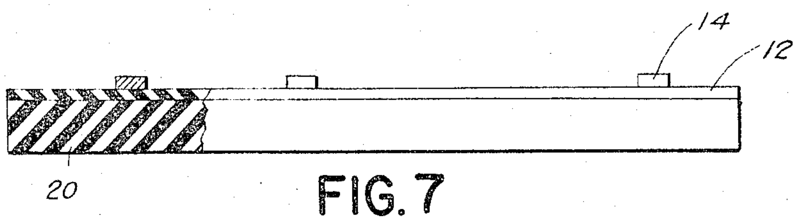
FIG. 7 is a similar view showing the pattern carrying film applied to a rigid base member.
Figure 8:
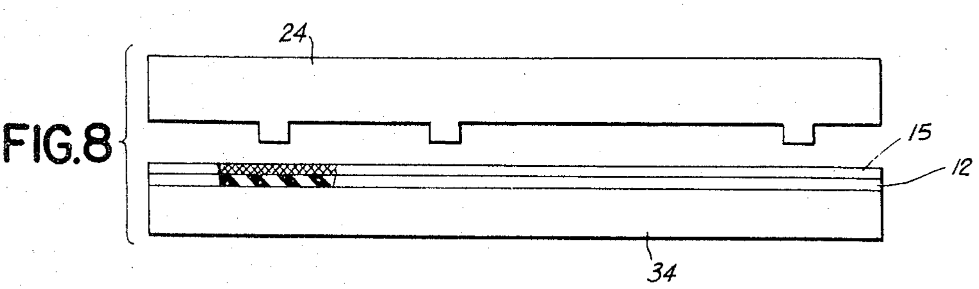
FIGS. 8 and 9 are views in side elevation of apparatus for producing a printed circuit on a thin dielectric film in accordance with another method.
Figure 9:
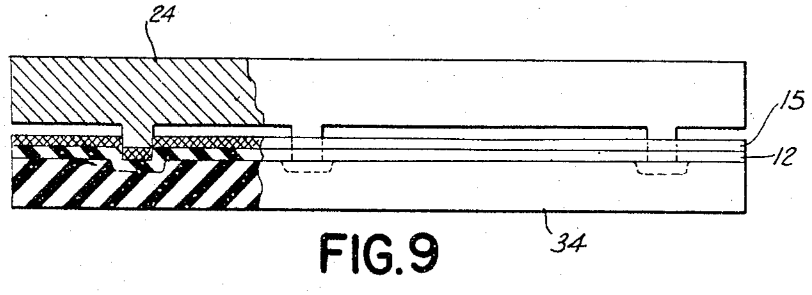

Referring now to the drawings, 10 represents a printed circuit structure produced in accordance with the present invention wherein 12 comprises a relatively thin dielectric sheet or film having a conductive metal foil circuit pattern 14 secured to one face thereof. As shown in FIGS. 1 and 3, the pattern carrying film 12 preferably comprises a plastic material including a synthetic fabric, such as Orlon, Dacron and the like, indicated at 16 having a phenolic resin coating 18 on both sides thereof providing a composite relatively thin, tough flexible pattern carrying dielectric film 12 which is capable of yielding relative to the metal foil sheet during the die-stamping operation to prevent tearing thereof. In one embodiment of the invention, as illustrated in FIG. 7, the pattern carrying film 12, with its die-stamped circuit pattern 14 secured thereto, may be attached to a relatively rigid insulating board 20.

Figure 4:
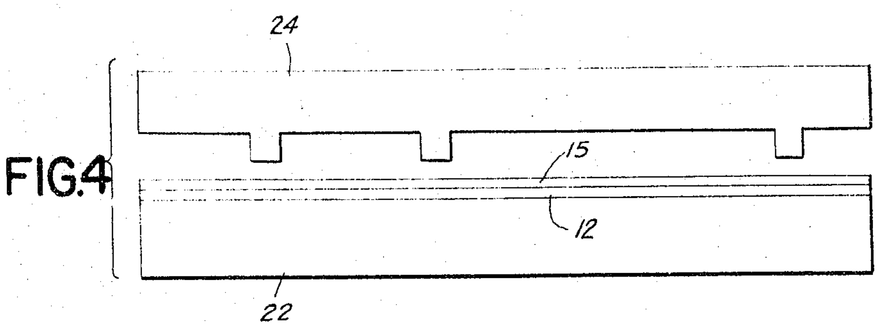
FIGS. 4 and 5 are views in side elevation of apparatus for applying a metal foil circuit pattern to a thin base sheet and illustrating the steps followed in accordance with one method of producing the present printed circuit structure.
Figure 5:
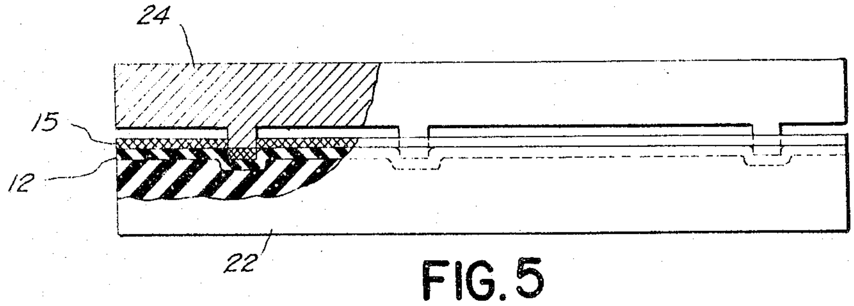

As illustrated in FIGS. 4 and 5, in accordance with one method of producing the present printed circuit structure a sheet of the composite film 12 and a sheet of conductive metal foil 15 may be placed in superimposed relation on a resilient lower die member 22. The upper die 24, shaped in the form of the circuit pattern to be punched out, is then lowered into engagement with the superimposed sheets to effect cutting of the metal foil to provide the circuit pattern desired. The resilient die or base member 22 may comprise rubber or like material capable of yielding to permit the film 12 to be depressed during the cutting operation, as shown in FIG. 5, yet maintaining sufficient rigidity to permit the foil cutting operation to be effected without tearing or damage to the dielectric film.

Figure 6:
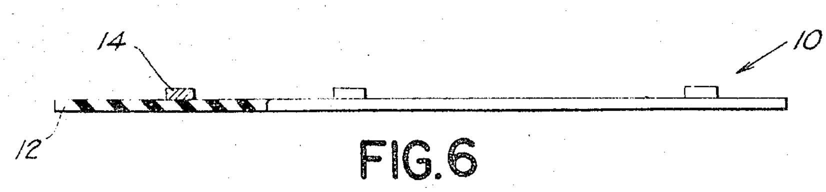
FIG. 6 is a view in side elevation of the printed circuit pattern structure produced by the method disclosed in FIGS. 4 and 5.

In practice the conductive foil 15 may be adhesively secured to the film 12, and after the stamping operation the remaining or unwanted foil may be removed to leave the deired printed circuit 14 as shown in FIG. 6. The printed circuit thus produced may then be removed from the resilient lower base 22 and may be adhesively secured to the relatively rigid insulating base 20 as shown in FIG. 7. The base member 20 may comprise a moldable fibrous insulating base sheet embodying a curable resin of the type disclosed in Patent No. 2,972,003, issued February 14, 1961, which material lends itself to molding operations in which it may be formed and cured by heat and pressure as disclosed in said patent.

Several advantages are derived from the present method of producing a printed circuit in the manner above described, which method includes the stamping of the circuit on a relatively thin dielectric film and then securing the film with its printed circuit onto an insulating base. Among other advantages the present method provides a convenient form of prepared flexible circuit patterns which may be easily stored and, if desired, may be subsequently applied to a relatively rigid insulating base. The provision of the dielectric film also greatly increases the dielectric properties of the insulating base 20 to which it is applied and also tends to strengthen the physical properties thereof. Furthermore, in following the above-defined method the base member 20, to which the combined circuit pattern and thin film is applied, is not deformed during the punching or stamping operation so that the flow characteristics of the moldable base sheet are not influenced or changed. During the molding operation the dielectric film also prevents any excess resin which may be present in the base member from flowing to and covering the surface of the conductive metal foil and effecting its conductivity, and the film also renders the circuit carrying surface substantially impervious to the harmful effects of gases.

In one form of the present invention the present printed circuit may be produced by cutting, stamping or otherwise forming the desired circuit pattern from a thin conductive metal foil sheet. The metal foil pattern may then be applied to a relatively thin sheet or dielectric film of the type heretofore described embodying a curable resin and the assembly subjected to heat and pressure. The resin on the film is thereby cured and the circuit pattern securely bonded thereto. Thereafter, the assembly of foil and film may be secured to a suitable base member in any preferred manner.

Figures 11, 12:
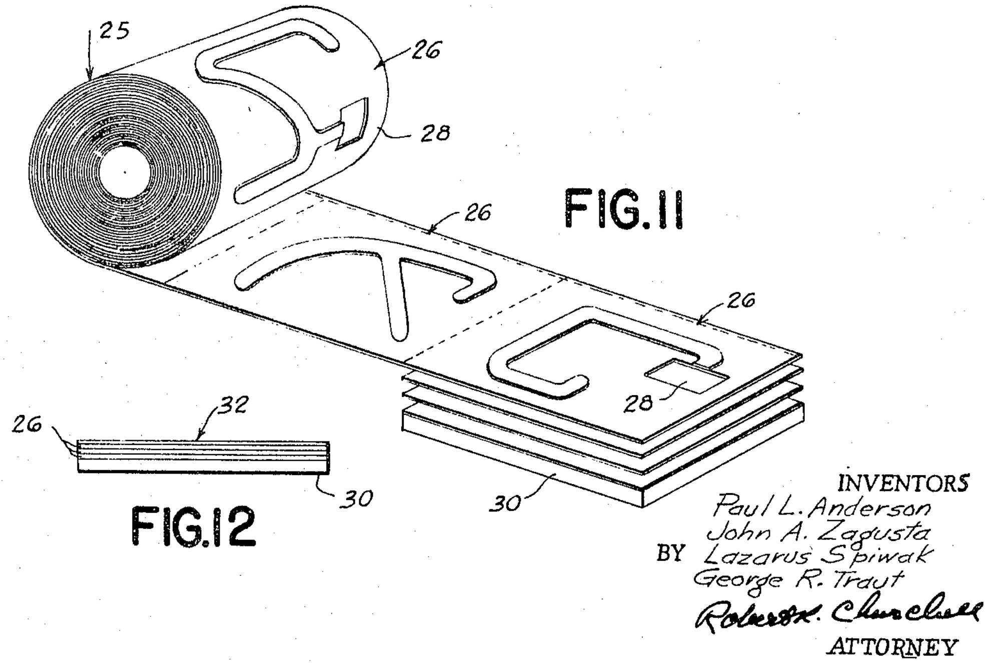
FIG. 11 is a diagrammatic perspective view illustrating the present circuit carrying film in roll form and also illustrating a method of producing a multicircuit unit therefrom.
FIG. 12 illustrates the multicircuit unit produced thereby.

The delineation of a conductive metal circuit pattern on a relatively thin and flexible dielectric film lends itself to other uses and advantages. For example, successive similar or different die-stamped circuits prepared on a continuous length of the film may be coiled and stored in roll form as shown at 25 in FIG. 11. The relatively thin circuit pattern carrying film may also be used with advantage in the production of a multicircuit printed structure embodying a plurality of superimposed individual circuit pattern having provisions for connecting selected of the circuit patterns. As diagrammatically illustrated in FIGS. 11 and 12, successive circuit carrying films 26 of a continuous strip may be severed from the strip and superimposed one upon the other, selected of the films having openings 28 therein exposing portions of underlying circuits to which they may be connected. In practice the superimposed circuit carrying films 26 may be adhesively secured to each other and mounted on a relatively rigid insulating base 30 to provide a multicircuit printed structure 32 as shown in FIG. 12.

Figure 10:
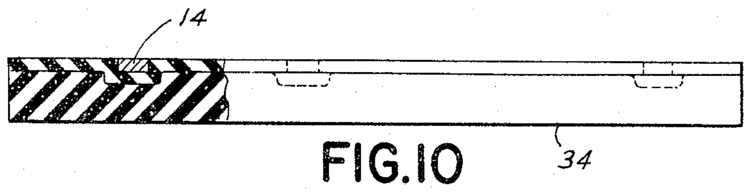
FIG. 10 is a side elevation partly in cross section of a printed circuit produced by the method illustrated in FIGS. 8 and 9.

In practicing one method of producing a printed circuit, as defined, the composite film 12 and the conductive metal foil is placed on a resilient supporting base or lower die to effect cutting of the metal foil pattern without injury to the dielectric film, whereupon the unwanted foil is removed. The pattern carrying film with its circuit may then be removed from the resilient base and secured to a relatively rigid insulating base. In a modified form of the above defined method it will be apparent that the superimposed film and conductive metal foil may be placed directly on and secured to a permanent insulating base 34 having resilient characteristics such as to permit the film to yield and be depressed into the base until the foil is severed during the stamping operation without injury to the dielectric material. The depressions made in the resilient base material during the stamping operation permit the dielectric film 12 to be bottomed in the depressions and the metal foil 12 to be cut by the upper die 24 without damage or tearing of the film. Upon removal of the severed unwanted foil the assembly may be placed in a mold and subjected to heat and pressure to thereby produce a flush type printed circuit 14 as shown in FIG. 10.

Figure 13:
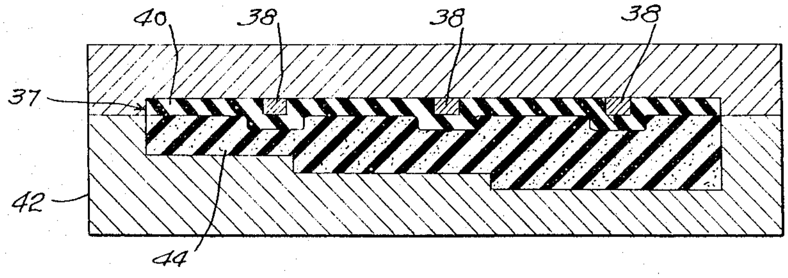
FIG. 13 is a side elevation of apparatus for securing the metal foil pattern and uncured flexible sheet to a base member while forming the base member from a molding powder or like material.

Another method of producing the present printed circuit assembly is illustrated in FIG. 13. In accordance with the illustrated method of producing the printed circuit assembly the desired metal foil printed circuit pattern 38 may be precut from a relatively thin conductive metal foil sheet and applied to a relatively thin dielectric film or sheet 40 embodying a curable resin. The dielectric sheet is preferably of the type hereintofore described and is coated on both sides with a curable resin, such as a phenolic resin. The metal foil and thin sheet or film assembly 37 is then placed in a mold 42 containing a molding material indicated at 44 which may be in the form of powder or pellets composed of phenolic resins and fillers, or any other material capable of being molded. The mold 42 may be of any desired shape to form a permanent casing or base for the circuit. The mold is closed, and the materials are subjected to heat and pressure. During the base molding operation the metal foil pattern 38 becomes bonded securely to the thin dielectric sheet 40 as the resin in the sheet is cured, and simultaneously the foil sheet assembly is bonded to the base or casing produced in the mold, the resins of the sheet and base being cured together.

The present method is of particular advantage in that a highly efficient bond is formed between the metal foil and sheet assembly, and the base member. Another advantage resides in the fact that the printed circuit assembly and base are bonded together during the formation of the base. Thus, the manufacturing step of separately forming the base member prior to securing the foil and sheet assembly thereto is eliminated.

As shown in FIG. 13, the metal foil pattern 38 may be embedded in the resinous coating on the dielectric sheet 40 during the molding operation to provide a flush type circuit pattern.

Figure 14:
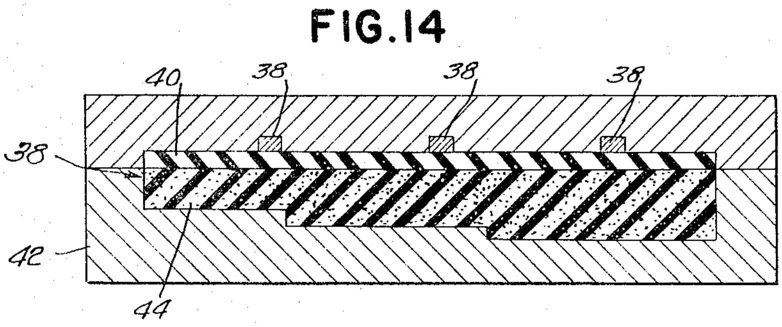
FIG. 14 is a side elevation of apparatus for bonding the precured metal foil pattern and flexible sheet to a base member while forming the base member from a molding powder or like material.

FIG. 14 is illustrative of still another method of producing the present printed circuit assembly 37. In accordance with this method the metal foil circuit pattern 38 is precut and applied to a similar relatively thin dielectric film or sheet 40 coated on both sides with a curable resin. The foil and sheet assembly is then subjected to heat and pressure to cure the resin in the sheet and securely bond the metal foil pattern to the sheet. Thereafter the cured foil and film assembly 37, similar to that illustrated in FIG. 3, is placed in a base mold 42 containing a moldable material 44 such as that hereintofore described. The mold is subjected to heat and pressure, the molding material cured, and the base member formed. During the base molding operation the foil and film assembly are bonded to the base member. As illustrated, the metal foil printed circuit pattern 38 produced in accordance with this method is raised above the surface of the foil sheet. One advantage of this method is that the precured foil and film are securely bonded together and may be stored or otherwise handled prior to the base molding operation.

The present invention in another form comprises producing a multicircuit structure in a rapid, efficient manner.

Figure 15:
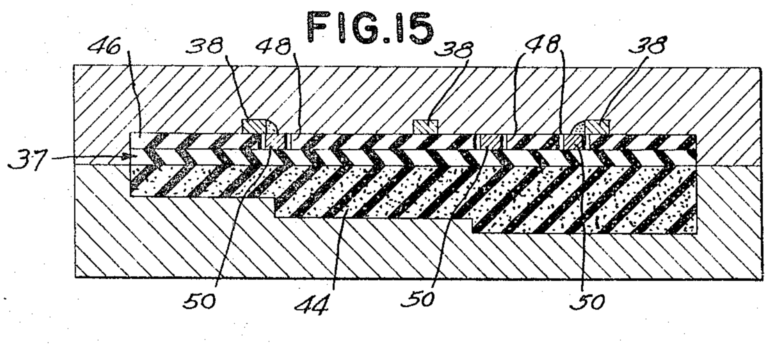
FIG. 15 is a side elevation of apparatus for bonding multiple metal foil pattern and flexible sheet assemblies to a base member while forming the base member from a molding powder or like material.

As illustrated in FIG. 15, a metal foil and thin dielectric film assembly 37 may be produced following any one of the methods hereintofore described. A second metal foil and thin film assembly 46 is also produced according to any one of the described methods. However, in the second assembly a single or plurality of apertures 48 are provided in the assembly adjacent desired portions of the circuit pattern. A molding material 44 of any desired material capable of being molded is placed in the mold, and the first sheet assembly 37 then is positioned in the mold. The second metal foil and film assembly 46 is then placed in the mold upon the first assembly such that the aperture or apertures 48 therein overlie portions 50 of the underlying circuit. The mold is then closed and suitable heat and pressure applied to cure the resin on each thin sheet and bond the same together and to form the base and bond the sheet assemblies to the base. Upon removal of the multilayered assemblies and base member from the mold the circuits of the over and underlying sheets may be connected to each other through the apertures in the overlying sheet assembly. In this manner a multicircuit and base structure may be readily and efficiently produced. It will be understood that for the purpose of illustration and not by way of limitation the illustrated multicircuit structure comprises two metal foil and thin film assemblies. However, in practice a multicircuit structure having more than two circuit layers may be produced in the foregoing manner whenever desired.

While in certain of the above methods the mold is described as containing a molding material, it will be understood that the metal foil and flexible assembly may be first inserted in the base mold and thereafter the molding material added thereto.

In practicing certain of the various methods, herein described, wherein the base member comprises insulating board material, it will be apparent that the thin, flexible dielectric film could be adhesively secured or laminated to the insulating board; the dielectric film, conductive metal foil and the insulating board could be laminated and then cut; or the individual sheets of film and conductive foil could be placed individually on the insulating base, and the pattern then die-cut. Also, in the methods wherein the foil and flexible sheet assembly is secured to the base member during the formation of the base member the metal foil may be initially adhesively secured to the dielectric film or sheet.

The pattern carrying film 12 and 40 preferably comprises a plastic material and has been herein described as comprising a synthetic fabric coated with a phenolic resin. Other materials which may be used with advantage in producing the present dielectric film may comprise; fiber structures, woven or non-woven, such as glass or asbestos, and films, such as polyester or other tough, electrical insulating films. The insulating base may also be produced from various materials including: combinations of various films, such as polyamide, polyacrylic, polyester, cellulose, asbestos and glass and phenolic epoxy, DAP or other suitable thermosetting resins. While the molding materials for forming the base member have herein been described as comprising powders or pellets composed of phenolic resins and fillers, other materials may be used, such as ceramic material and glass. It will be understood that the dielectric film 12 and 40, herein illustrated, has been greatly enlarged for clearness of illustration. Actually, in practice the thickness of the film may be about 0.005", and the thickness of the conductive metal pattern is preferably about 0.00135–0.0027 but not limited to those thicknesses.

While the preferred embodiment of the invention has been herein illustrated and described it will be understood that the invention may be embodied in other forms within the scope of the following claims.

Having thus described the invention, what is claimed is:

1. The method of producing a printed circuit assembly which comprises the steps of applying a thin conductive metal die-cut foil on a relatively thin, tough and flexible resin-coated sheet of insulating material, placing the foil and flexible sheet assembly on a resilient base member, die-stamping the foil with a die to provide a predetermined metal foil circuit pattern on the insulating sheet, said die having a raised face thereon shaped in the form of said circuit pattern, and said insulating sheet and resilient base member in the region immediately beneath said raised die face yielding sufficiently during the die-stamping to permit the edge of said raised die face to cut said circuit pattern from the foil sheet without interrupting the continuous surface of the insulating sheet, removing the unwanted foil disposed about said cut metal foil circuit pattern from the insulating sheet, removing the sheet of insulating material from said resilient base member, and permanently bonding said cut metal foil circuit pattern to said insulating sheet.

2. The method of producing a printed circuit assembly as defined in claim 1 which includes the step of placing the die-cut foil and flexible sheet assembly on a relatively rigid insulating base member, and then securely bonding the pattern sheet assembly and base together, said flexible sheet substantially increasing the dielectric properties of the insulating base member.

3. The method of producing a printed circuit assembly as defined in claim 1, wherein the flexible sheet of insulating material embodies a curable resin coating to which said metal foil is applied, said method including the steps of curing the curable resin coating to bond the metal foil circuit pattern to the flexible sheet, and then bonding the cured foil and sheet assembly to a base member.

References Cited by the Examiner

UNITED STATES PATENTS

| | | | |
|---|---|---|---|
| 1,646,613 | 10/1927 | Courtenay | 156—251 |
| 2,431,393 | 11/1947 | Franklin | 156—251 X |

| | | | |
|---|---|---|---|
| 2,622,054 | 12/1952 | Franklin | 156—251 |
| 2,647,852 | 8/1953 | Franklin. | |
| 2,969,300 | 1/1961 | Franz. | |

EARL M. BERGERT, *Primary Examiner.*

CARL F. KRAFFT, *Examiner.*

DOUGLAS J. DRUMMOND, HAROLD ANSHER, *Assistant Examiners.*

UNITED STATES PATENT OFFICE

CERTIFICATE OF CORRECTION

Patent No. 3,301,730 January 31, 1967

Lazarus Spiwak et al.

It is certified that error appears in the above identified patent and that said Letters Patent are hereby corrected as shown below:

Column 6, line 47, cancel "die-cut".

Signed and sealed this 11th day of November 1969.

(SEAL)
Attest:

Edward M. Fletcher, Jr.
Attesting Officer

WILLIAM E. SCHUYLER, JR.
Commissioner of Patents